(12) United States Patent
Maeda

(10) Patent No.: US 9,466,378 B2
(45) Date of Patent: Oct. 11, 2016

(54) SEMICONDUCTOR MEMORY DEVICE

(71) Applicant: KABUSHIKI KAISHA TOSHIBA, Tokyo (JP)

(72) Inventor: Takashi Maeda, Kamakura Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/842,637

(22) Filed: Sep. 1, 2015

(65) Prior Publication Data

US 2016/0267994 A1  Sep. 15, 2016

(30) Foreign Application Priority Data

Mar. 9, 2015 (JP) .................................. 2015-045974

(51) Int. Cl.
*G11C 16/04* (2006.01)
*G11C 16/12* (2006.01)
*G11C 16/08* (2006.01)

(52) U.S. Cl.
CPC ........... *G11C 16/12* (2013.01); *G11C 16/0483* (2013.01); *G11C 16/08* (2013.01)

(58) Field of Classification Search
USPC ........................... 365/185.17, 185.18, 185.11
See application file for complete search history.

(56) References Cited

U.S. PATENT DOCUMENTS

| 7,428,165 | B2 * | 9/2008 | Oowada | G11C 16/0483 257/E27.103 |
|---|---|---|---|---|
| 7,936,004 | B2 | 5/2011 | Kito et al. | |
| 2007/0047312 | A1 * | 3/2007 | Aritome | G11C 16/0483 365/185.17 |
| 2010/0074021 | A1 * | 3/2010 | Aritome | G11C 16/12 365/185.17 |
| 2010/0315875 | A1 * | 12/2010 | Kim | G11C 16/0483 365/185.17 |

* cited by examiner

*Primary Examiner* — Vu Le
(74) *Attorney, Agent, or Firm* — Patterson & Sheridan, LLP

(57) ABSTRACT

A semiconductor memory device includes a plurality of memory cell transistors electrically connected in series, a bit line electrically connected to a first end of the memory cell transistors, a source line and a well region electrically connected to a second end of the memory cell transistors, and first and second selection transistors electrically connected in series between the second end of the memory cell transistors and the source line. During programming of a selected memory cell transistor, a first voltage is applied to the source line and the well region, and to a gate of the first selection transistor, and a second voltage smaller than the first voltage is applied to a gate of the second selection transistor.

20 Claims, 16 Drawing Sheets

SEMICONDUCTOR MEMORY DEVICE

CROSS-REFERENCE TO RELATED APPLICATION

This application is based upon and claims the benefit of priority from Japanese Patent Application No. 2015-045974, filed Mar. 9, 2015, the entire contents of which are incorporated herein by reference.

FIELD

Embodiments described herein relate generally to a semiconductor memory device.

BACKGROUND

NAND type flash memory devices where memory cells are arranged in three dimensions are known in the art.

DETAILED DESCRIPTION

Figure 1:
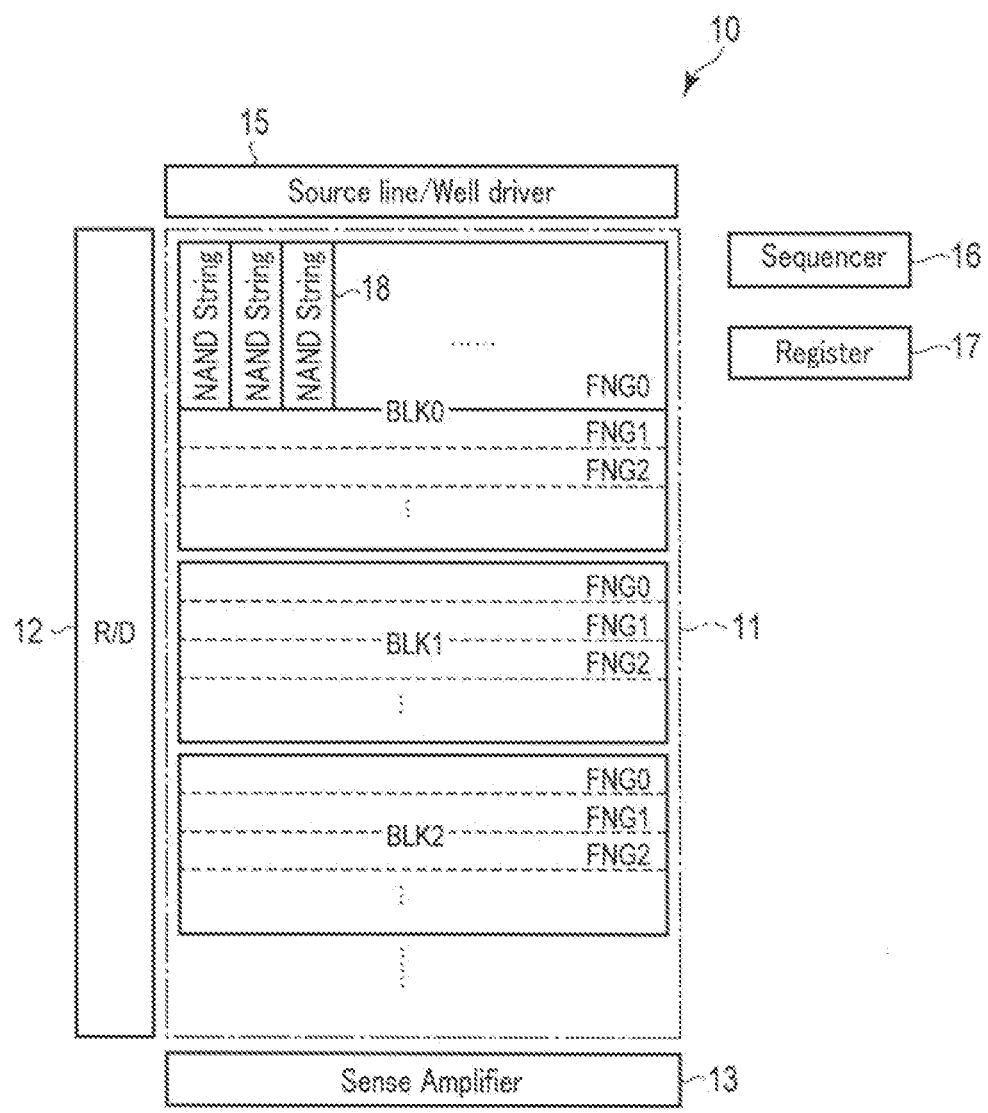
FIG. 1 is a block diagram of a semiconductor memory device according to a first embodiment.

Embodiments provide a semiconductor memory device with reduced chip area, that is capable of stopping a through-current.

In general, according to one embodiment, a semiconductor memory device includes a plurality of memory cell transistors electrically connected in series, a bit line electrically connected to a first end of the memory cell transistors, a source line and a well region electrically connected to a second end of the memory cell transistors, and first and second selection transistors electrically connected in series between the second end of the memory cell transistors and the source line. During programming of a selected memory cell transistor, a first voltage is applied to the source line and the well region, and to a gate of the first selection transistor, and a second voltage smaller than the first voltage is applied to a gate of the second selection transistor.

Hereinafter, preferred embodiments will be described with reference to the drawings. In the drawings, the same reference numerals are attached to the same components.

First Embodiment

A semiconductor memory device according to a first embodiment will be described with reference to FIGS. 1 to 9. Here, a description will be made, by way of example, using a three dimensional stacked NAND type flash memory as a semiconductor memory device.

Structure in the First Embodiment

The structure of the semiconductor memory device according to the first embodiment will be described with reference to FIGS. 1 to 3.

As illustrated in FIG. 1, the semiconductor memory device (NAND type flash memory) 10 includes a memory cell array 11, a row decoder 12, a sense amplifier 13, a source line/well driver 15, a sequencer 16, and a register 17.

The memory cell array 11 includes a plurality of blocks BLK (BLK0, BLK1, BLK2, . . . ). Each block BLK is a group of a plurality of nonvolatile memory cells. Each nonvolatile memory cell is related to each other by word line and bit line. The block BLK is the erasure unit of data, such that the data within the same block BLK is erased at the same time. Each block BLK includes a plurality of fingers FNG (FNG0, FNG1, FNG2, . . . ). Each finger FNG is a group of NAND strings 18 with the memory cells connected in series. The number of the blocks within the memory cell array 11 and the number of the fingers within one block BLK are arbitrary.

The erasure of the data within the block BLK is not only performed at the same time but also may be performed in units smaller than the block, for example, the unit of half block (HBL). The case of erasing data by the unit smaller than the block is disclosed, for example, in U.S. patent application Ser. No. 13/235,389 "Non-Volatile Semiconductor Memory Device" filed in Sep. 18, 2011 and in U.S. patent application Ser. No. 12/694,690 filed in Jan. 27, 2010. Both applications are incorporated by reference herein.

The row decoder 12 decodes the block address and the page address, to select some word line of the corresponding block. The row decoder 12 applies various types of voltages to a selected word line and an unselected word line.

At a reading time of data, the sense amplifier 13 senses the data read from a memory cell to a bit line. Further, at a writing time of data, the sense amplifier 13 transfers the write data to a memory cell. Reading and writing of data for the memory cell array 11 is performed for a unit of operation that includes several memory cells. More specifically, the above operation is collectively performed on a plurality of memory cell transistors MT connected in common to some word line WL of some finger FNG in some block. This data unit is referred to as "page".

The source line/well driver 15 applies the same voltage to the source line and the well region in each operation.

The register 17 stores various signals. The register 17 stores the status, for example, of data writing and erasing operation. According to this, the register 17 notifies a controller (not illustrated) whether or not the operation has been normally completed. The register 17 also stores the command and the address received from the controller, and stores various tables.

The sequencer 16 controls the operation of the entire NAND type flash memory 10.

Figure 2:
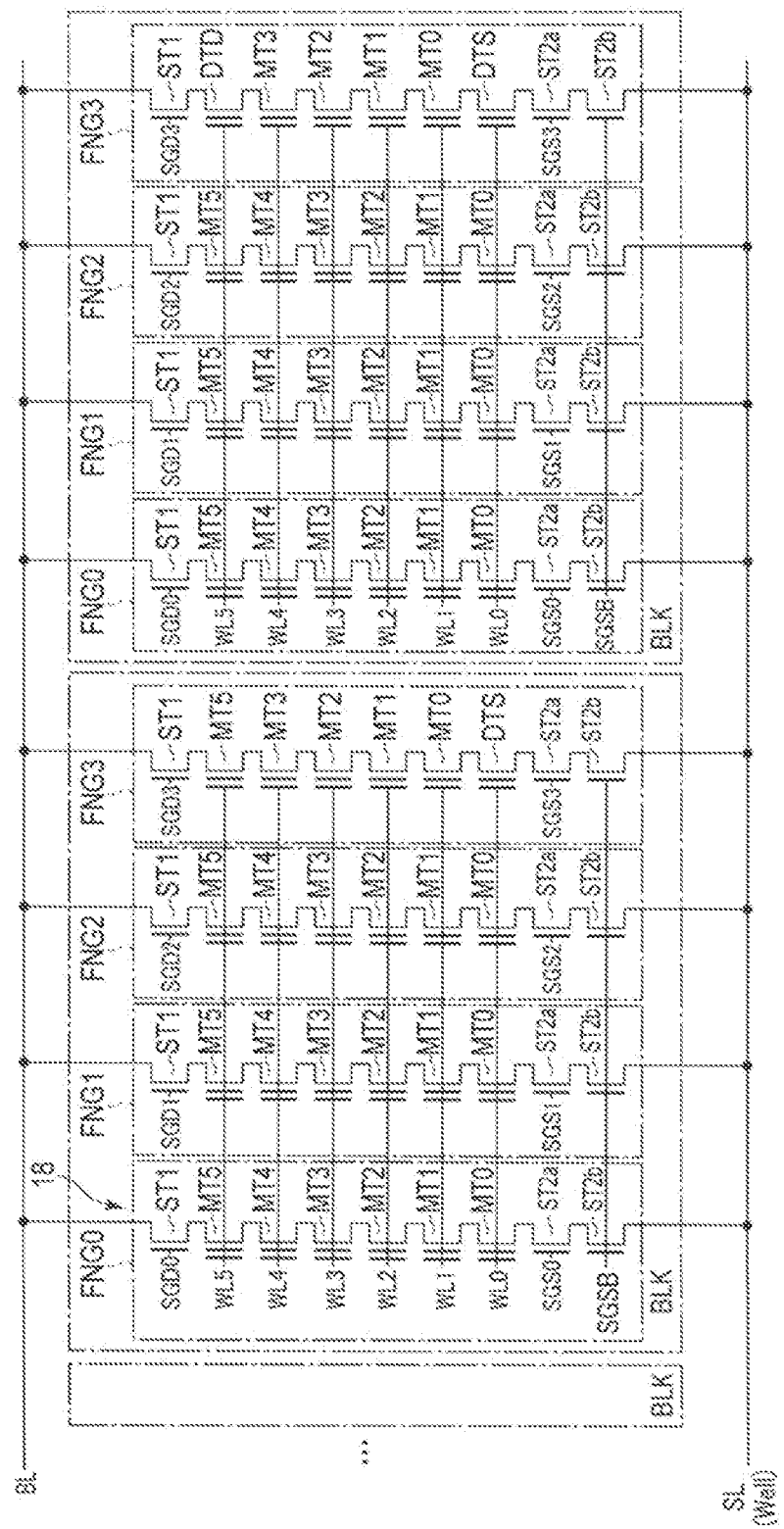
FIG. 2 is a circuit diagram illustrating a memory cell array in the semiconductor memory device according to the first embodiment.

FIG. 2 illustrates a circuit diagram of two adjacent blocks BLK. Further, it illustrates the case of one NAND string including six memory cell transistors MT. FIG. 3 is a cross sectional view of the memory cell array corresponding to FIG. 2.

As illustrated in FIG. 2, each block BLK includes, for example, four fingers FNG (FNG0 to FNG3) aligned in the right and left direction (D1) on the paper surface. Further, each finger FNG includes a plurality of NAND strings 18 aligned in the deep direction (D2) on the paper surface.

Each NAND string 18 includes, for example, six memory cell transistors MT (MT0 to MT5) and select transistors ST (the select transistor ST1 on the drain side and the select transistor ST2 on the source side). The select transistor ST2 includes two select transistors ST2a and ST2b.

The memory cell transistors MT are arranged between the select transistors ST1 and ST2 to forma current path in series. One end of the memory cell transistor MT5 on one side is connected to one end of the select transistor ST1 and one end of the memory cell transistor MT0 on the other side is connected to one end of the select transistor ST2 (ST2a). Further, the other end of the select transistor ST1 is connected to the bit line BL. While, the other end of the select transistor ST2a is connected to one end of the select transistor ST2b. Then, the other end of the select transistor ST2b is connected to the source line SL and well.

The source line SL and well connect together the NAND strings 18 aligned in the right and left direction D1 on the paper surface. Further, although it is not illustrated, the source line SL and well connects together the NAND strings 18 aligned in the depth direction D2 with respect to the paper surface. A plurality of bit lines BL, not illustrated, are aligned in the depth direction D2 with respect to the paper surface and the NAND strings 18 aligned in the right and left direction D1 on the paper surface are connected together to the same bit line BL. Further, the source line SL and the bit line BL are connected in common to the NAND strings 18 within a plurality of blocks BLK.

The gates of the respective select transistors ST1 in the respective fingers FNG0 to FNG3 are connected together to the respective select gate lines SGD0 to SGD3. Further, the gates of the respective select transistors ST2a in the respective fingers FNG0 to FNG3 are connected together to the respective select gate lines SGS0 to SGS3. While, the gates of the respective select transistors ST2b are connected to the same select gate line SGSB in common across multiple fingers. The respective control gates of the memory cell transistors MT0 to MT5 in the same block are connected to the respective word lines WL0 to WL5 in common.

Figure 3:
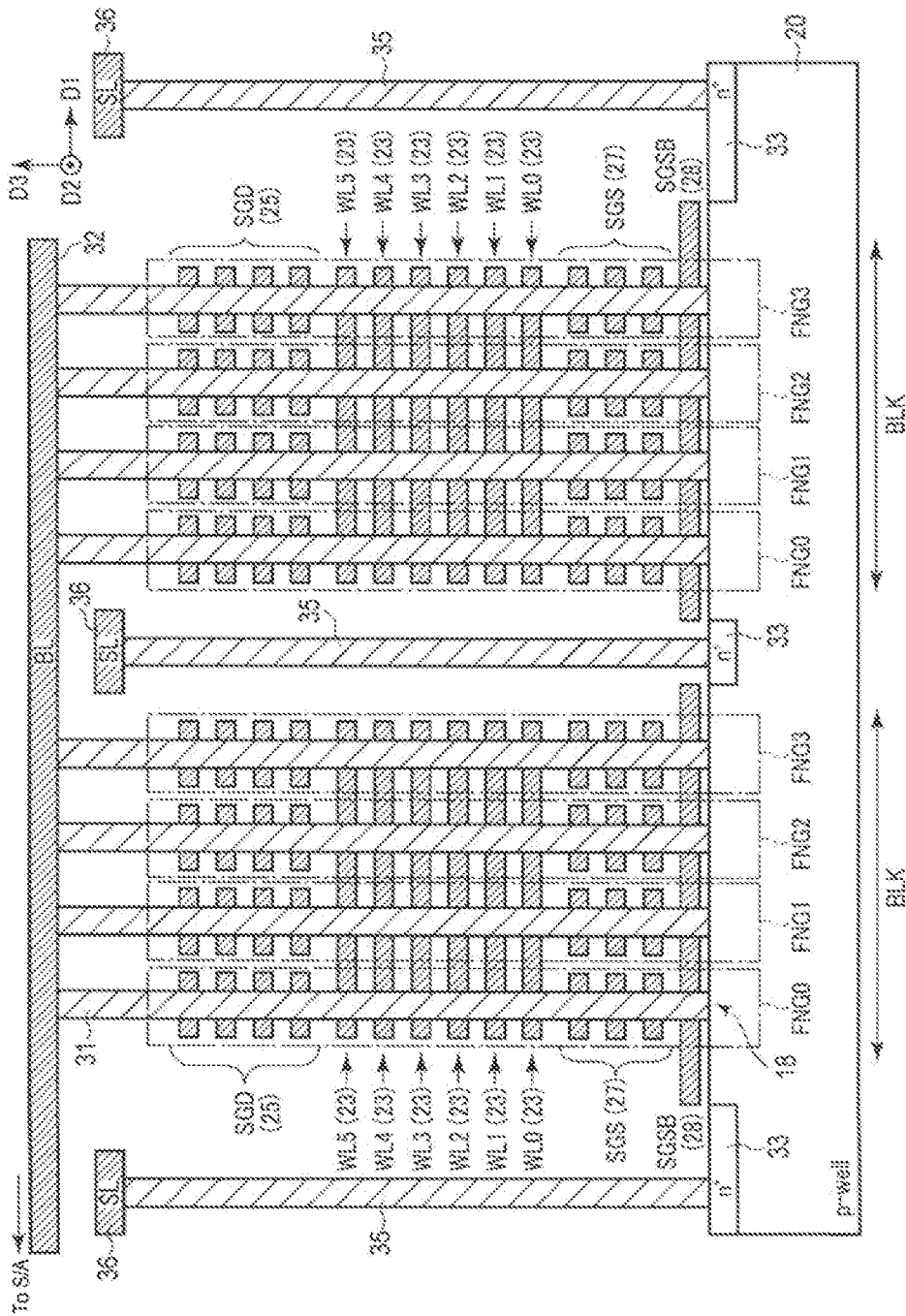
FIG. 3 is a cross sectional view illustrating the memory cell array in the semiconductor memory device according to the first embodiment.

As illustrated in FIG. 3, a plurality of NAND strings 18 are provided on the p-well region 20 of the semiconductor substrate.

More specifically, pillar-shaped semiconductor layers 31 extend in a stacking direction (D3) on the p-well region 20. A semiconductor layer 31 works as a current path of the NAND string 18 and forms a channel at an operation time of the memory cell transistors MT and the select transistors ST. To cover the periphery of the semiconductor layer 31, a tunnel insulating layer, not illustrated, a charge storage layer, and a block insulating layer are provided in this order. Then, in order to cover the periphery of the block insulating layer, a wiring layer 28, a plurality of wiring layers 27, a plurality of wiring layers 23, and a plurality of wiring layers 25 are sequentially provided in this order from the bottom in the stacking direction.

The wiring layer 28 operates as a select gate line SGSB, the wiring layer 27 operates as a select gate line SGS, the wiring layer 23 operates as a word line WL, and the wiring layer 25 operates as a select gate line SGD.

The pillar-shaped semiconductor layer 31, the respective insulating layers (tunnel insulating layer, charge storage layer, and block insulating layer), and the wiring layer 28 form the select transistor ST2b. Further, the pillar-shaped semiconductor layer 31, the respective insulating layers, and the wiring layer 27 form the select transistor ST2a. The pillar-shaped semiconductor layer 31, the respective insulating layers, and the wiring layer 23 form the memory cell transistor MT. The pillar-shaped semiconductor layer 31, the respective insulating layers, and the wiring layer 25 form the select transistor ST1.

Here, a plurality (three layers in this example) of the wiring layers 27 are electrically connected in common to the same select gate line SGS. In other words, the three layers of the wiring layers 27 actually work as the gate electrode of one select transistor ST2a. This is true for the select transistor ST1 (four layered select gate line SGD).

According to the above structure, the select transistors ST2b and ST2a, the memory cell transistors MT, and the select transistor ST1 are sequentially stacked on the well region 20 in the respective NAND strings 18.

A wiring layer 32 working as the bit line BL is provided in the upper end of the semiconductor layer 31. The bit line BL is connected to the sense amplifier 13.

Further, each n+ dopant diffusion layer 33 is provided on the surface of the p-well region 20 in a way of interposing the several semiconductor layers 31. A contact plug 35 is provided on each n+ dopant diffusion layer 33 and a wiring layer 36 is provided on the contact plug 35 to operate as a source line SL. The wiring layer 36 is formed higher than the select gate line SGD and lower than the wiring layer 32. These p-well regions 20 and the n+ dopant diffusion layers 33 (source lines SL) are connected to a common node (for example, the upper layer wiring in common). Alternatively, only the source line SL may be connected to the upper layer wiring and the p-well region 20 and the source line SL (n+ dopant diffusion layer 33) may be short-circuited.

A gate insulating layer is formed between the p-well region 20 and the wiring layer 28 and the wiring layer 28 and the gate insulating layer are formed in the vicinity of the n+ dopant diffusion layer 33. Therefore, when the select transistor ST2b is turned on, a channel is formed not only in the semiconductor layer 31 but also on the surface of the well region 20. In short, the select transistor ST2b electrically connects the select transistor ST2a to the diffusion layer 33. According to this, by applying a voltage to the diffusion layer 33 (source line SL), a potential may be given to the channel of the semiconductor layer 31. On the other hand, the semiconductor layer 31 is connected to the well region 20. Therefore, also by applying a voltage to the well region 20, a potential may be given to the channel.

In this example, the well region 20 and the source line SL are formed as a common node and therefore, the same voltage is applied to the above. In short, based on the same voltage, a potential is given to the channel of the semiconductor layer 31.

The memory cell array 11 may be formed in another structure. In short, the structure of the memory cell array 11 is disclosed in, for example, U.S. patent application Ser. No. 12/407,403 "Three Dimensional Stacked Nonvolatile Semiconductor Memory" filed in Mar. 19, 2009. Further, it is also disclosed in U.S. patent application Ser. No. 12/406,524 "Three Dimensional Stacked Nonvolatile Semiconductor Memory" filed in Mar. 18, 2009, U.S. patent application Ser. No. 12/679,991 "Nonvolatile Semiconductor Memory Device and Method of Manufacturing the Same" filed in Mar. 25, 2010, and U.S. patent application Ser. No. 12/532,030 "Semiconductor Memory and Method of Manufacturing the Same" filed in Mar. 23, 2009. The entire contents of these patent applications are incorporated herein by reference.

Writing Operation in the First Embodiment

The writing operation in the semiconductor memory device according to the first embodiment will be described with reference to FIGS. 4 to 7.

Figure 4:
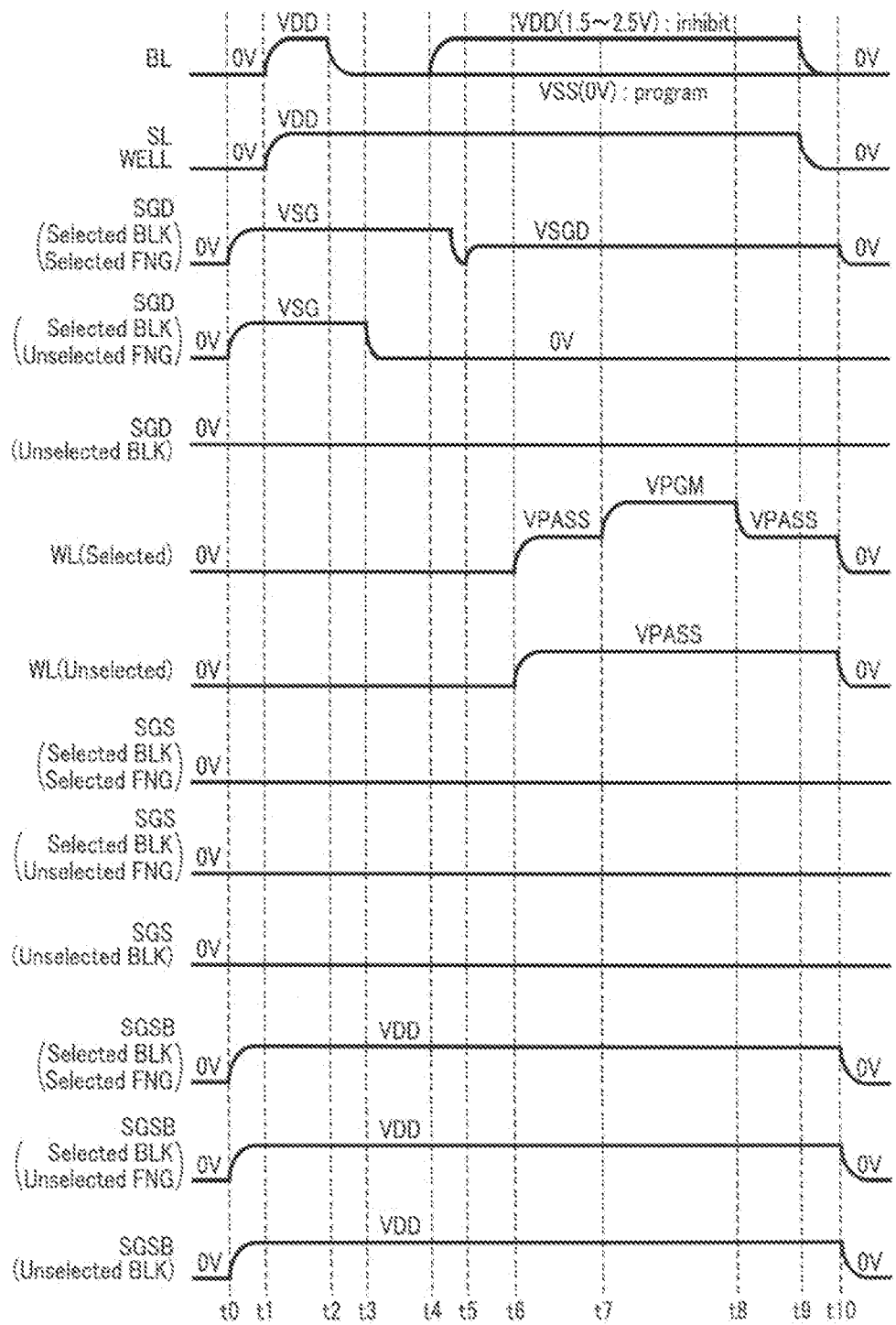
FIG. 4 is a timing chart of various voltages during a writing operation according to the first embodiment.

As illustrated in FIG. 4, at the time t0, the row decoder 12 applies a voltage VSG to the select gate line SGD of the selected finger FNG in the selected block BLK and the select gate line SGD of the unselected finger FNG in the selected block BLK. The voltage VSG is a voltage for turning on the select transistor ST1.

At the time t0, the row decoder 12 applies a voltage VDD (for example, 1.5 to 2.5 V) to the select gate line SGSB of the selected finger FNG in the selected block BLK, the select gate line SGSB of the unselected finger FNG in the selected block BLK, and the select gate line SGSB in the unselected block BLK.

Further, the row decoder 12 applies a voltage VSS (for example, 0 V) to the select gate line SGS of the selected finger FNG in the selected block BLK, the select gate line SGS of the unselected finger FNG in the selected block BLK, and the select gate line SGS in the unselected block BLK.

Next, at the time t1, the sense amplifier 13 applies the voltage VDD to all the bit lines BL. The select transistor ST1 transfers this voltage from drain to source. In short, a channel is precharged.

On the other hand, the source line/well driver 15 applies the voltage VDD to all the source lines SL and the well regions 20.

Then, after the sense amplifier 13 applies 0 V to all the bit lines BL at the time t2, the row decoder 12 applies 0 V to the select gate line SGD of the unselected finger FNG in the selected block BLK at the time t3. According to this, the channel in the unselected finger FNG in the selected block BLK has been precharged.

At the time t4, the sense amplifier 13 applies 0 V to the selected bit line BL (i.e., bit line BL targeted by the program) and applies the voltage VDD to the unselected bit line BL (i.e., bit line BL to be inhibited). The select transistor ST1 transfers these voltages from the drain to the source.

At the time t5, the row decoder 12 lowers the voltage applied to the select gate line SGD of the selected finger FNG in the selected block BLK to the voltage VSGD, which is less than VSG. According to this, the select transistor ST1 corresponding to the unselected bit line BL (in other words, the bit line BL with the voltage VDD applied) is turned off.

At the time t6, the row decoder 12 applies a voltage VPASS to the selected word line WL and the unselected word line WL. Then, at the time t7, the row decoder 12 raises the voltage applied to the selected word line WL to voltage VPGM, hence to execute the program operation.

On the other hand, in the NAND string corresponding to the unselected bit line BL, since the select transistor ST1 is in an off state, the channel is electrically in a floating state. As the result, the potential of the channel is raised to VBST according to the coupling with the word line WL, so as to inhibit programming. Also in the string of the unselected finger FNG in the selected block BLK, since the select transistor ST1 is in an state, the programming is not executed. Further, also in the string in the unselected block BLK, since the select transistor ST1 is in an off state and further the word line WL is in a floating state, the programming is not executed.

Next, at the time t8, the row decoder 12 lowers the selected word line WL to a voltage VPASS, hence to complete the program operation.

Then, at the time t9, the sense amplifier 13 lowers the selected bit line BL to 0 V and the source line/well driver 15 lowers the source line SL and the well region 20 to 0 V.

Further, at the time t10, the row decoder 12 lowers the select gate line SGD of the selected finger FNG in the selected block BLK to 0 V. The row decoder 12 lowers the selected word line WL and the unselected word line WL to 0 V. The row decoder 12 lowers the select gate line SGSB of the selected finger FNG in the selected block BLK, the select gate line SGSB of the unselected finger FNG in the selected block BLK, and the select gate line SGSB in the unselected block BLK to 0 V.

As mentioned above, the writing operation according to the first embodiment is performed.

In the timing chart illustrated in FIG. 4, a timing of applying the voltage VSG to the select gate line SGD of the selected finger FNG in the selected block BLK and the select gate line SGD of the unselected finger FNG in the selected block BLK is not restricted to the time t0 but may be any time before the timing (time t1) of applying the voltage VDD to the bit line BL.

A timing of applying the voltage VDD to the select gate line SGSB of the selected finger FNG in the selected block BLK, the select gate line SGSB of the unselected finger FNG in the selected block BLK, and the select gate line SGSB in the unselected block BLK may be any time before the timing (time t1) of applying the voltage VDD to the source line SL and the well region 20.

Further, a timing of lowering the select gate line SGSB of the selected finger FNG in the selected block BLK to 0 V may be any time after the timing (time t9) of lowering the bit line BL to 0 V.

A timing of lowering the select gate line SGSB of the selected finger FNG in the selected block BLK, the select gate line SGSB of the unselected finger FNG in the selected block BLK, and the select gate line SGSB in the unselected block BLK to 0 V may be any time after the timing (time t9) of lowering the source line SL and the well region 20 to 0 V.

The other timing of applying various voltages is not restricted to the timing illustrated in FIG. 4.

In all the strings during the above mentioned writing operation (especially, program operation at the time t7 to t8), through-current from the source line SL/well region 20 to the bit line BL is stopped. A principle thereof will be described as below.

Figure 5A:
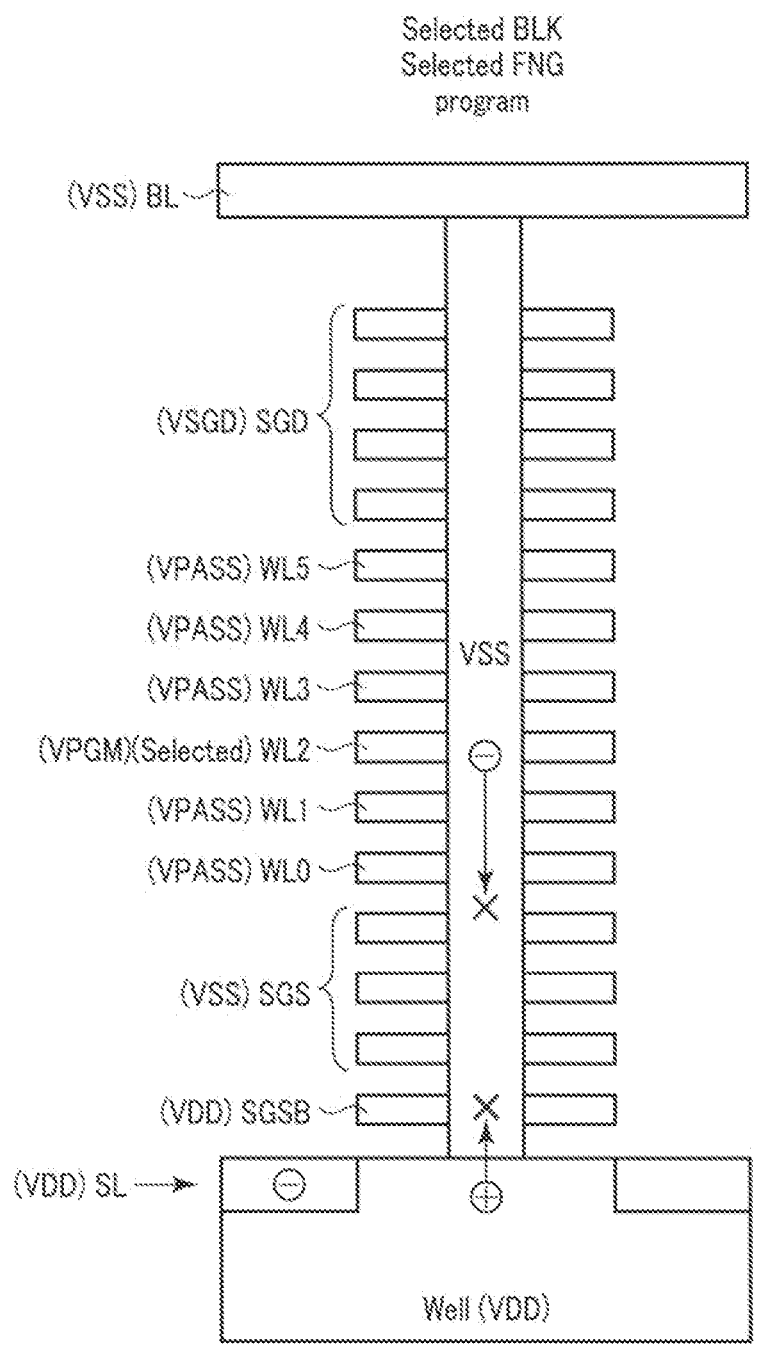
FIG. 5A is a view illustrating various voltages of a selected string of a selected finger in a selected block, that are applied during programming according to the first embodiment.

Referring to FIG. 5A, in the program mode at the time t7 to t8, in the selected string of the selected finger FNG in the selected block BLK, the voltage VSS (0 V) is applied to the bit line BL, the voltage VSGD is applied to the select gate line SGD, the voltage VPGM is applied to the selected word line WL, the voltage VPASS is applied to the unselected word line WL, the voltage VSS is applied to the select gate line SGS, the voltage VDD is applied to the select gate line SGSB, and the voltage VDD is applied to the source line and the well region 20.

By the voltage VSS (0 V) applied to the bit line BL and the voltage VSGD applied to the select gate line SGD, the select transistor ST1 is turned on. According to this, the voltage VSS is transferred from the bit line BL to the channel and simultaneously electrons are injected there as carriers.

From the viewpoint of the channel, the voltage VDD of the well region 20 is larger than the voltage VSS of the channel and therefore, the electrons within the channel tend to flow to the side of the well region 20. Here, the voltage VSS is applied to the select gate line SGS. Therefore, the electrons within the channel are cut-off by the select transistor ST2a, hence to avoid the through-current caused by the electrons within the channel. In other words, when the carrier is the electrons within the channel, the voltage VSS is applied to the select gate line SGS of the select transistor ST2a working as an N channel type transistor, hence to turn off the above transistor.

On the other hand, in the well region 20, holes exist as the carriers and in the source line SL (diffusion layer 33), electrons exist as the carriers.

From the viewpoint of the well region 20, the voltage VSS of the channel is smaller than the voltage VDD of the well region 20 and therefore, the holes within the well region 20 tend to flow to the side of the channel. Here, the voltage VDD is applied to the select gate line SGSB. In short, the same voltage VDD is applied to the well region 20 and the select gate line SGSB (VGS is 0 V). Therefore, the holes within the well region 20 are cut-off by the select transistor ST2b, so as to avoid the through-current caused by the holes within the well region 20. In other words, when the carrier is the holes within the well region 20, the voltage VDD is applied to the select gate line SGSB of the select transistor ST2b serving as a P channel type transistor, so as to turn off the above transistor.

From the viewpoint of the source line SL, the voltage VSS of the channel is smaller than the voltage VDD of the source line SL (diffusion layer 33), and therefore the electrons within the diffusion layer 33 do not flow to the side of the channel.

As mentioned above, in the selected string of the selected finger FNG in the selected block BLK, it is possible to avoid the generation of the through-current caused by various carriers.

Figure 5B:
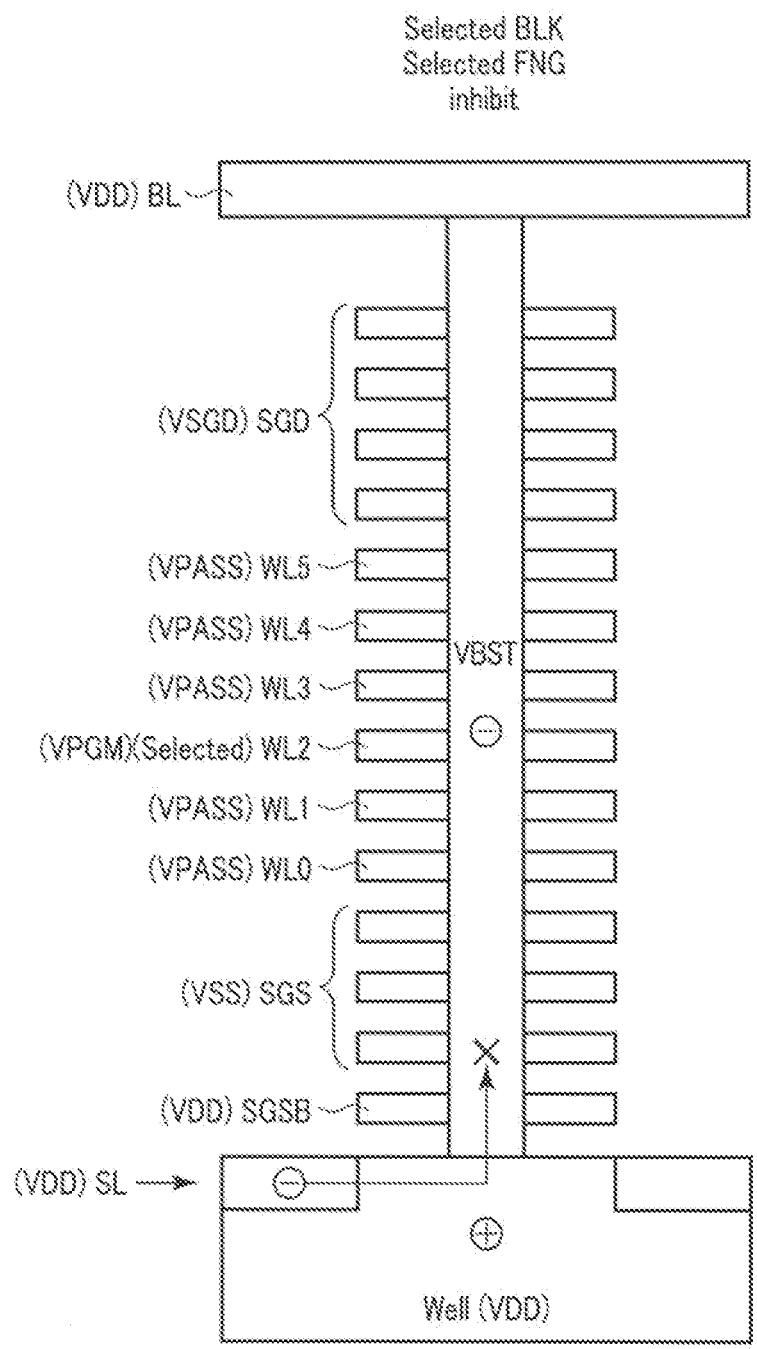
FIG. 5B is a view illustrating various voltages of an unselected string of a selected finger in the selected block, that are applied during programming according to the first embodiment.

Referring to FIG. 5B, in the program mode at the time t7 to t8, in the unselected string of the selected finger FNG in the selected block BLK, the voltage VDD is applied to the bit line BL, the voltage VSGD is applied to the select gate line SGD, the voltage VPGM is applied to the selected word line WL, the voltage VPASS is applied to the unselected word line WL, the voltage VSS is applied to the select gate line SGS, the voltage VDD is applied to the select gate line SGSB, and the voltage VDD is applied to the source line and the well region 20.

By the voltage VDD applied to the bit line BL and the voltage VSGD (<VDD) applied to the select gate line SGD, the select transistor ST1 is turned off. According to this, in the program mode, carriers (electrons) are not injected from the bit line BL to the channel but the channel is in a floating state. In the channel of the unselected string, however, the voltage VDD is transferred during the initial period of the program (the period just after the time t4). Therefore, the electrons have been already injected in the channel of the unselected string. The voltage of the channel of the unselected string is raised to the voltage VBST (>VDD) according to the coupling with the word line WL in the program mode.

From the viewpoint of the channel, the voltage VDD of the well region 20 is smaller than the voltage VBST of the channel and therefore the electrons within the channel do not flow to the side of the well region 20.

Meanwhile, from the viewpoint of the well region 20, the voltage VBST of the channel is larger than the voltage VDD of the well region 20 and therefore, the holes within the well region 20 do not flow to the side of the channel.

From the viewpoint of the source line SL, the voltage VBST of the channel is larger than the voltage VDD of the source line SL (diffusion layer 33) and therefore, the electrons within the diffusion layer 33 tend to flow to the side of the channel. Here, the voltage VSS is applied to the select gate line SGS. Therefore, the electrons within the diffusion layer 33 are cut-off by the select transistor ST2a, so as to avoid the through-current caused by the electrons within the diffusion layer 33. In other words, when the carrier is the electrons within the diffusion layer 33, the voltage VSS is applied to the select gate line SGS of the select transistor ST2a serving as the N channel type transistor, so as to turn off the transistor.

According to this, in the unselected string of the selected finger FNG in the selected block BLK, generation of the through-current may be avoided.

Figure 6:
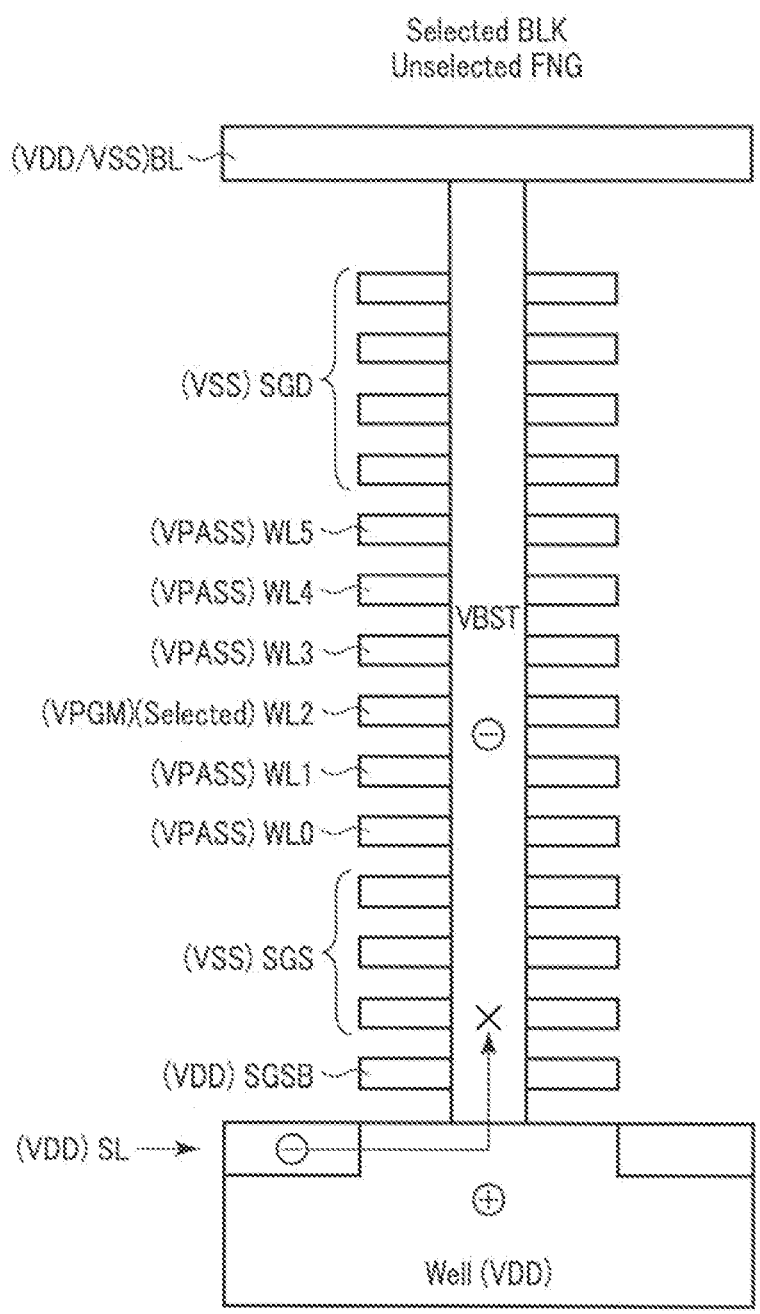
FIG. 6 is a view illustrating various voltages of a string of an unselected finger in the selected block, that are applied during programming according to the first embodiment.

Referring to FIG. 6, in the program mode at the time t7 to t8, in the string of the unselected finger FNG in the selected block BLK, the voltage VDD/VSS is applied to the bit line BL, the voltage VSS is applied to the select gate line SGD, the voltage VPGM is applied to the selected word line WL, the voltage VPASS is applied to the unselected word line WL, the voltage VSS is applied to the select gate line SGS, the voltage VDD is applied to the select gate line SGSB, and the voltage VDD is applied to the source line and the well region 20.

By the voltage VDD/VSS applied to the bit line BL and the voltage VSS applied to the select gate line SGD, the select transistor ST1 is turned off. According to this, in the program mode, carriers (electrons) are not injected from the bit line BL to the channel, but the channel is in a floating state. However, the voltage VDD is transferred to the channel of the string of the unselected finger FNG during the precharge period (the period of the time t1 to t2). Therefore, in the channel of the string of the unselected finger FNG, the electrons have been already injected. The voltage of the channel of the string of the unselected finger FNG is raised to the voltage VBST according to the coupling with the word line WL in the program mode.

From the viewpoint of the channel, the voltage VDD of the well region 20 is smaller than the voltage VBST of the channel and therefore, the electrons within the channel do not flow to the side of the well region 20.

Meanwhile, from the viewpoint of the well region 20, the voltage VBST of the channel is larger than the voltage VDD of the well region 20 and therefore, the holes within the well region 20 do not flow to the side of the channel.

From the viewpoint of the source line SL, the voltage VBST of the channel is larger than the voltage VDD of the source line SL (diffusion layer 33) and therefore, the electrons within the diffusion layer 33 tend to flow to the side of the channel. Here, the voltage VSS is applied to the select gate line SGS. Therefore, the electrons within the diffusion layer 33 are cut-off by the select transistor ST2a, so as to avoid the through-current caused by the electrons within the diffusion layer 33.

According to this, generation of the through-current may be avoided in the string of the unselected finger FNG in the selected block BLK.

Figure 7:
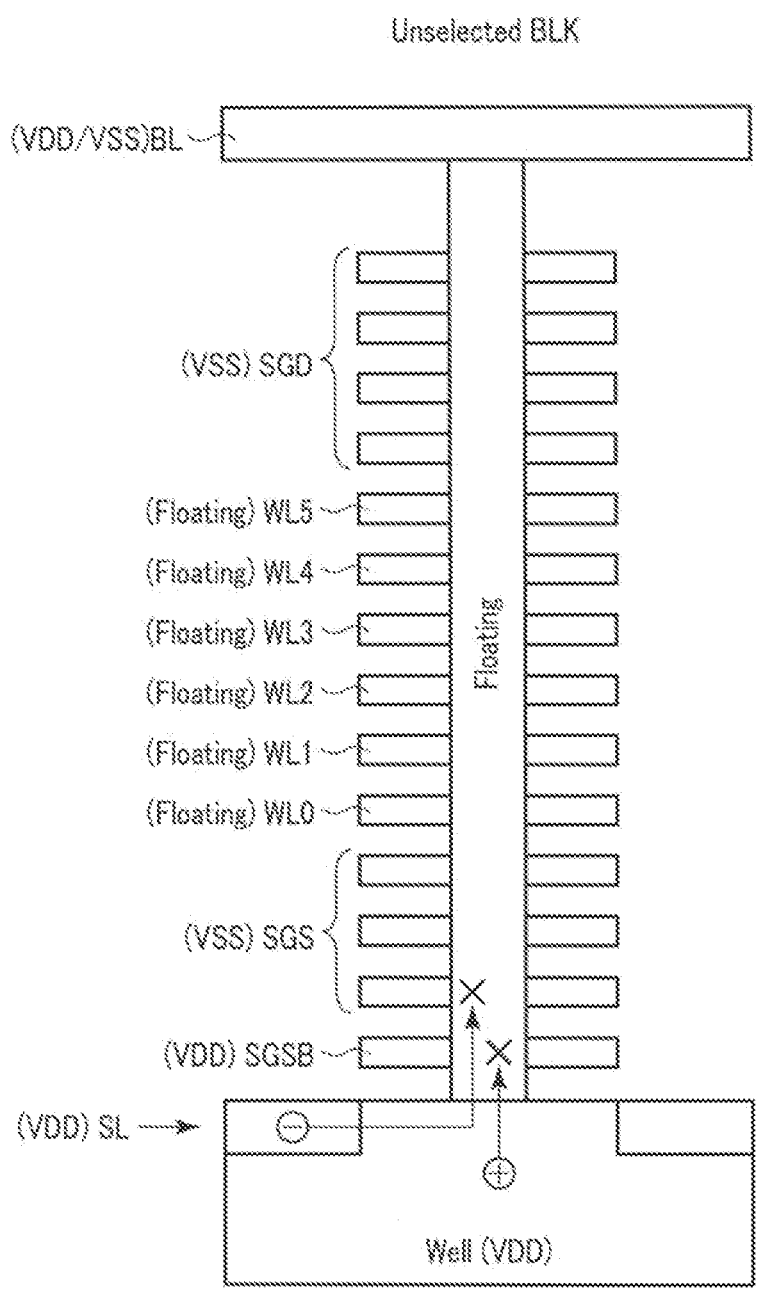
FIG. 7 is a view illustrating various voltages of a string in an unselected block, that are applied during programming according to the first embodiment.

Referring to FIG. 7, in the program mode at the time t7 to t8, in the string in the unselected block BLK, the voltage VDD/VSS is applied to the bit line BL, the voltage VSS is applied to the select gate line SGD, the voltage VSS is applied to the select gate line SGS, the voltage VDD is applied to the select gate line SGSB, and the voltage VDD is applied to the source line and the well region 20. The word line WL is in a floating state.

By the voltage VDD/VSS applied to the bit line BL and the voltage VSS applied to the select gate line SGD, the select transistor ST1 is turned off. According to this, in the program mode, carriers (electrons) are not injected from the bit line BL to the channel, and the channel is in a floating state. Since the word line WL is in a floating state, the voltage of the channel is not actually raised according to the coupling with this word line WL. The voltage of the word line WL, however, is raised according to the coupling with the word line WL and the source line SL of an adjacent selected block BLK and according to this, the voltage of the channel is raised to a voltage between the voltage VSS and the voltage VDD.

Here, from the viewpoint of the channel, since there is no carrier in the channel, the through-current does not flow there.

Meanwhile, from the viewpoint of the well region 20, the voltage of the channel is smaller than the voltage VDD of the well region 20 and therefore, the holes within the well region 20 tend to flow to the side of the channel. Here, the voltage VDD is applied to the select gate line SGSB. Therefore, the holes within the well region 20 are cut-off by the select transistor ST2b, so as to avoid the generation of the through-current caused by the holes within the well region 20.

From the viewpoint of the source line SL, the voltage of the channel is smaller than the voltage VDD of the source line SL (diffusion layer 33) and therefore, the electrons within the diffusion layer 33 do not flow to the side of the channel. Even if the voltage of the channel is larger than the voltage VDD of the source line SL (diffusion layer 33), the electrons within the diffusion layer 33 are cut-off by the select transistor ST2a, so as to avoid the generation of the through-current caused by the electrons within the diffusion layer 33.

Thus, generation of the through-current may be avoided in the string in the unselected block BLK.

Effects of the First Embodiment

Figure 8:
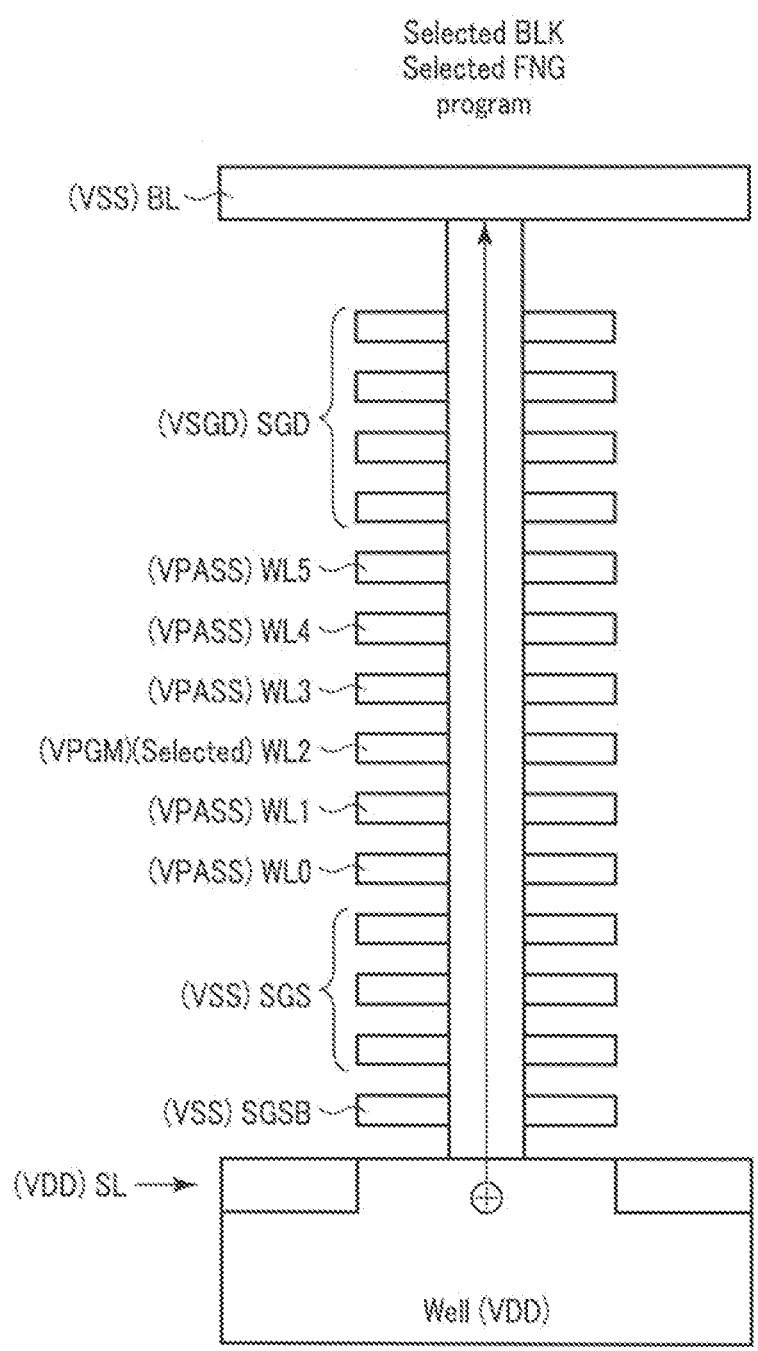
FIG. 8 is a view illustrating various voltages of the selected string of the selected finger in the selected block, that are applied during programming according to a first comparison example.

As illustrated in FIG. 8, in a first comparison example, the voltage VSS is applied to the select gate line SGSB differently from the embodiment illustrated in FIG. 5A. From the viewpoint of the well region 20, the voltage VSS of the channel is smaller than the voltage VDD of the well region 20 and therefore, the holes within the well region 20 tend to flow to the side of the channel. Here, the voltage VSS is applied to the select gate lines SGSB and SGS. Therefore, the holes are not cut-off by the select transistors ST2b and ST2a, and hence flow to the channel. The voltage VSS is applied to the select gate line SGD and therefore, the holes are not cut-off by the select transistor ST1. As the result, the holes flow to the bit line BL, thereby generating the through-current.

Figure 9:
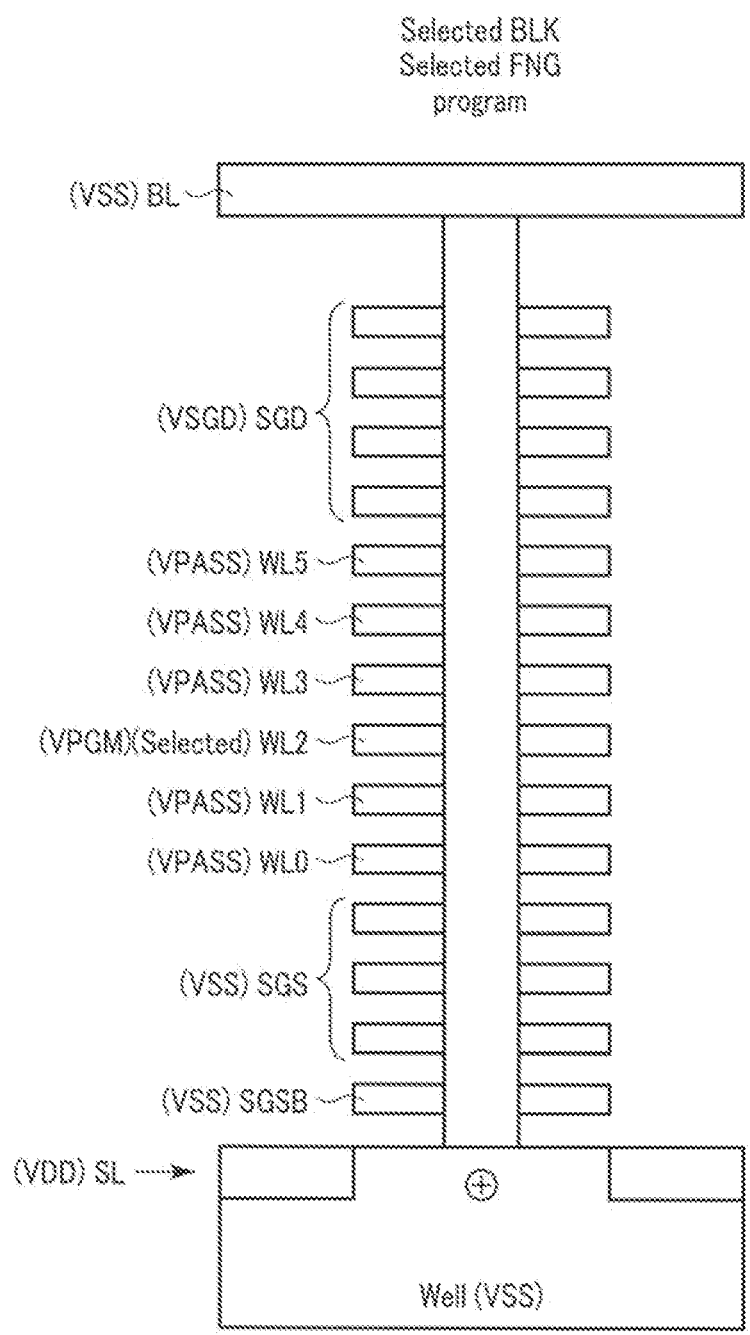
FIG. 9 is a view illustrating various voltages of the selected string of the selected finger in the selected block, that are applied during programming according to a second comparison example.

In a second comparison example, the voltage VSS is applied to the well region 20, as illustrated in FIG. 9. In this case, the voltage VSS of the well region 20 is equal to the voltage VSS of the channel and therefore, the holes within the well region 20 do not flow to the side of the channel. While the voltage VSS is applied to the well region 20, the voltage VDD is applied to the source line SL. In this situation, the well region 20 and the source line SL have to be controlled with separate drivers, thereby resulting in an increase in the circuit and the wiring, and making it more difficult to reduce the chip area. There is a case of short-circuit in the source line SL and the well region 20 during the process. In this case, such a control as to apply the separate voltages to the source line SL and the well region 20 is not performed.

In order to address the above problem, according to the first embodiment, the same voltage VDD is applied to the source line SL and the well region 20 in the writing mode. Then, the voltage VSS is applied to the select gate line SGS, and the voltage VDD is applied to the select gate line SGSB. According to this, the electrons from the source line SL (n+ type dopant diffusion layer 33) and the electrons from the semiconductor layer 31 are cut-off by the select transistor ST1, and the holes from the well region 20 are cut-off by the select transistor ST2b. Accordingly, it is possible to avoid the through-current from flowing between the source line SL and well region 20 and the bit line BL.

In the first embodiment, the same voltage VDD is applied to the source line SL and the well region 20 in the writing mode, as mentioned above. The same voltage is applied to the source line SL and the well region 20 also in the reading mode and the erasing mode. According to this, it is not necessary to apply different voltages to the source line SL and the well region 20 and thus one driver (source line/well driver 15) may control the voltage of the source line SL and the well region 20. Therefore, the number of the circuits and the wirings may be reduced and also the chip area may be reduced. Further, even if the source line SL and the well region 20 are short-circuited during the process, this does not cause any problem in the operation.

Further, in the first embodiment, by sharing the upper layer wiring for supplying a voltage to the source line SL and the well region 20, the wiring provided for exclusive use in the well region may be actually deleted. According to this, the wiring area of the source line SL where the current flow in the reading mode gets even larger, and the wiring resistance, may be reduced. As the result, noise during the reading mode may be reduced, thereby improving the reliability.

Second Embodiment

Hereinafter, a semiconductor memory device according to a second embodiment will be described with reference to FIGS. 10 and 11. In the second embodiment, the description of the same points as the first embodiment is omitted and the different points will be mainly described.

Writing Operation in the Second Embodiment

The writing operation in the semiconductor memory device according to the second embodiment will be described with reference to FIGS. 10 and 11.

Figure 10:
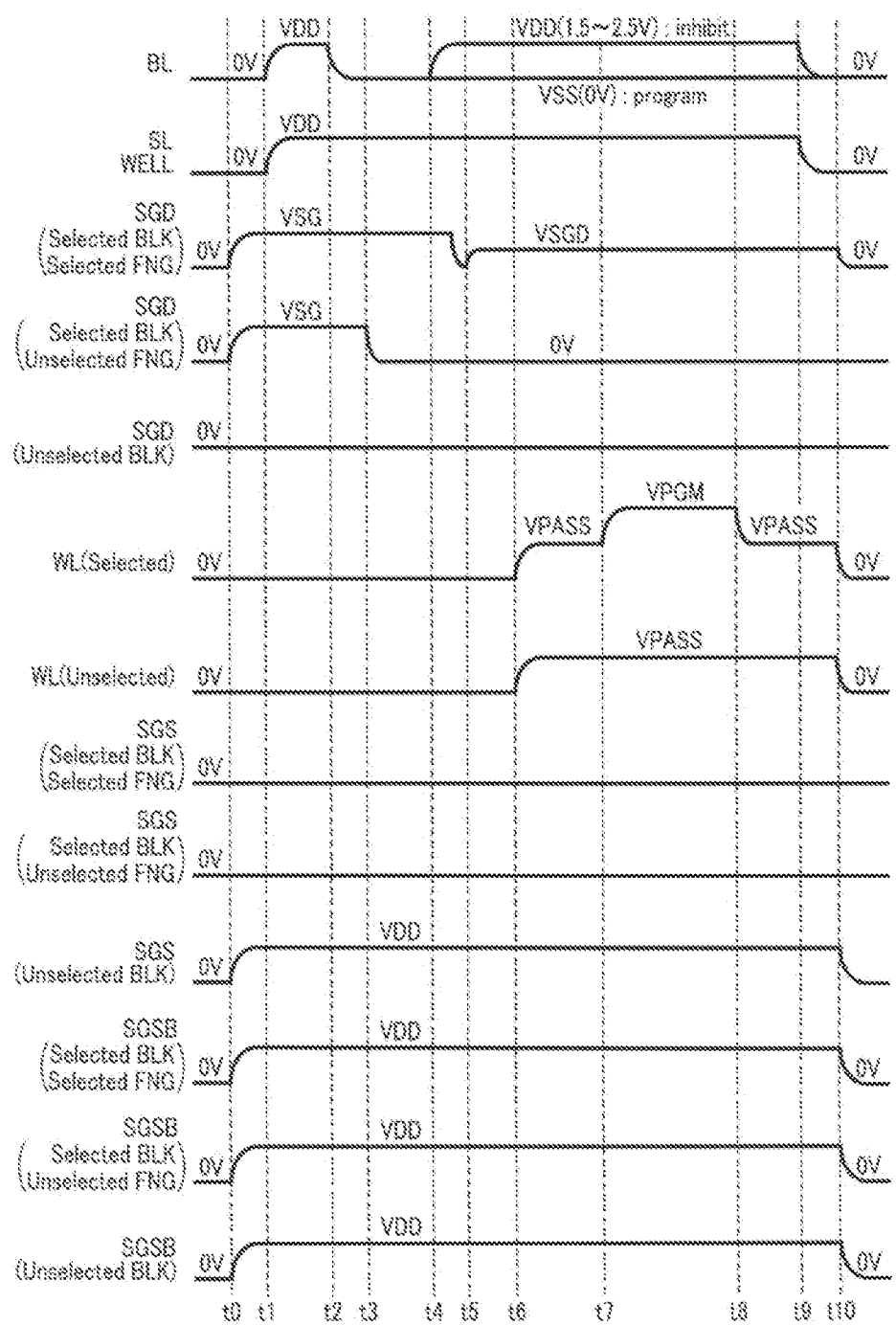
FIG. 10 is a timing chart of various voltages during a writing operation according to a second embodiment.

As illustrated in FIG. 10, the second embodiment is different from the first embodiment in that the voltage VDD is applied to the select gate line SGS in the unselected block BLK in the writing mode.

More specifically, at the time t0, the row decoder 12 applies the voltage VDD to the select gate line SGS in the unselected block BLK. At the time t10, the row decoder 12 lowers the voltage applied to the select gate line SGS in the unselected block BLK to 0 V. In other words, in the program mode at the time t7 to t8, the voltage VDD is applied to the select gate line SGS in the unselected block BLK.

In the string in the unselected block BLK in the above mentioned writing operation mode (especially, the program operation at the time t7 to t8), the through-current from the source line SL/well region 20 to the bit line BL is stopped. A principle thereof will be hereinafter described.

Figure 11:
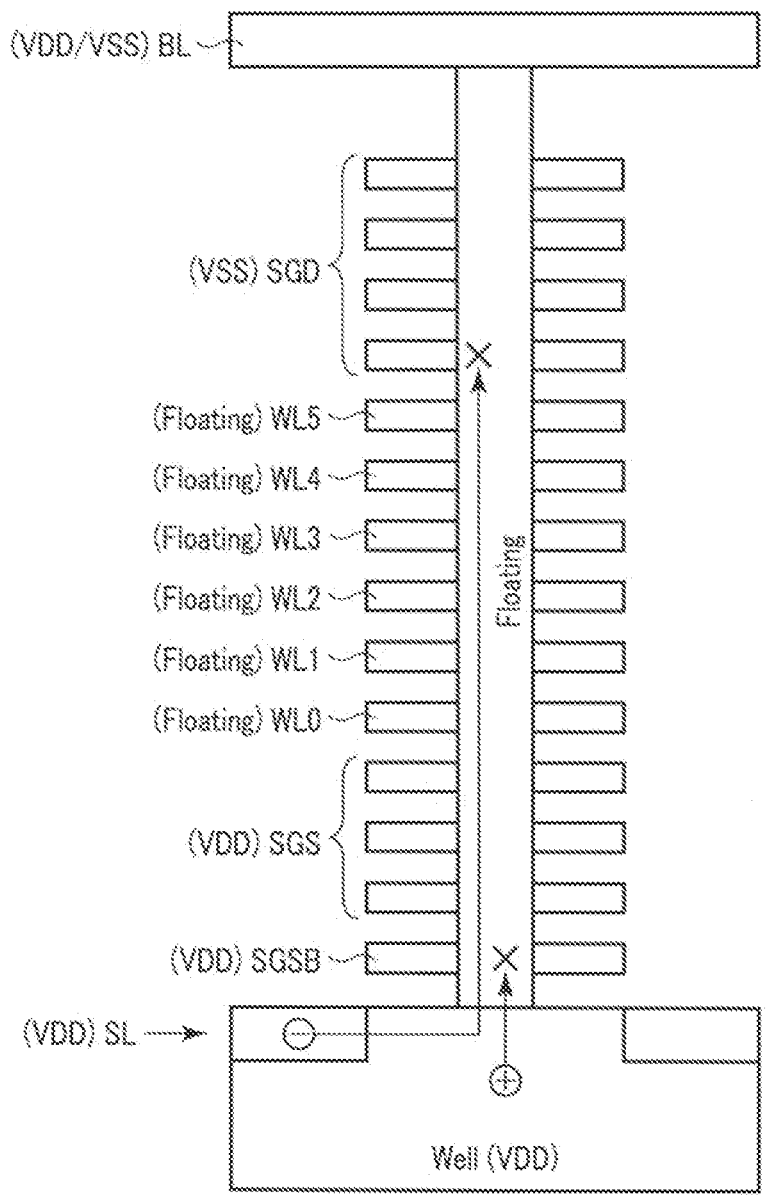
FIG. 11 is a view illustrating various voltages of a string in the unselected block, that are applied during programming according to the first embodiment.

As illustrated in FIG. 11, in the program mode at the time t7 to t8, in the string in the unselected block BLK, the voltage VDD/VSS is applied to the bit line BL, the voltage VSS is applied to the select gate line SGD, the voltage VDD is applied to the select gate line SGS, the voltage VDD is applied to the select gate line SGSB, and the voltage VDD is applied to the source line and the well region 20. The word line WL is in a floating state.

By the voltage VDD/VSS applied to the bit line BL and the voltage VSS applied to the select gate line SGD, the select transistor ST1 is turned off. According to this, in the program mode, carriers (electrons) are not injected from the bit line BL to the channel and the channel is in a floating state. Since the word line WL is in a floating state, the voltage of the channel is not actually raised according to the coupling with this word line WL. The voltage of the word line WL, however, is raised according to the coupling with the word line WL and the source line SL of an adjacent selected block BLK and according to this, the voltage of the channel is raised to a voltage between the voltage VSS and the voltage VDD.

From the viewpoint of the channel, there is no carrier in the channel and the through-current does not flow there.

Meanwhile, from the viewpoint of the well region 20, the voltage of the channel is smaller than the voltage VDD of the well region 20 and therefore, the holes within the well region 20 tend to flow to the side of the channel. Here, the voltage VDD is applied to the select gate lines SGSB and SGS. Therefore, the holes within the well region 20 are cut-off by the select transistor ST2b or the select transistor ST2a, hence to avoid the generation of the through-current caused by the holes within the well region 20.

Further, from the viewpoint of the source line SL, the voltage of the channel is smaller than the voltage VDD of the source line SL (diffusion layer 33) and therefore, the electrons within the diffusion layer 33 do not flow to the side of the channel. Even if the voltage of the channel is larger than the voltage VDD of the source line SL (diffusion layer 33), the electrons within the diffusion layer 33 are cut-off by the select transistor ST1, so as to avoid the generation of the through-current caused by the electrons within the diffusion layer 33.

According to this, generation of the through-current may be avoided in the string in the unselected block BLK.

Effects of the Second Embodiment

In the first embodiment, the holes from the well region 20 are cut off only by the select transistor ST2b. However, in each string, holes may leak through the select transistor ST2b. Even if this leak is small in any one unselected block BLK, the leak becomes large in all the unselected blocks BLK.

In order to solve the above problem, according to the second embodiment, the voltage VDD is applied not only to the select gate line SGSB but also to the select gate line SGS. According to this, the holes from the well region 20 may be cut-off by the select transistor ST2b and the select transistor ST2a. In short, compared to the first embodiment, the holes from the well region 20 may be more effectively cut-off and the leak may be suppressed more.

The voltage VSS is applied to the select gate line SGD. Therefore, even if the electrons from the diffusion layer 33 flow to the channel, the electrons may be cut-off by the select gate line SGD.

The select gate line SGSB and the select gate line SGS are raised to the same voltage VDD. According to this, the capacitance load therebetween may be reduced, and the voltage may be raised easily.

Third Embodiment

Hereinafter, a semiconductor memory device according to a third embodiment will be described with reference to FIGS. 12 to 15. In the third embodiment, a different point from the first embodiment will be mainly described with the same point omitted.

Writing Operation in the Third Embodiment

The writing operation of the semiconductor memory device according to the third embodiment will be described with reference to FIGS. 12-15.

As illustrated in FIGS. 12-15, the third embodiment is different from the first embodiment in that the select gate line SGS or SGSB in the unselected block BLK is in a floating state in the writing mode.

Figure 12:
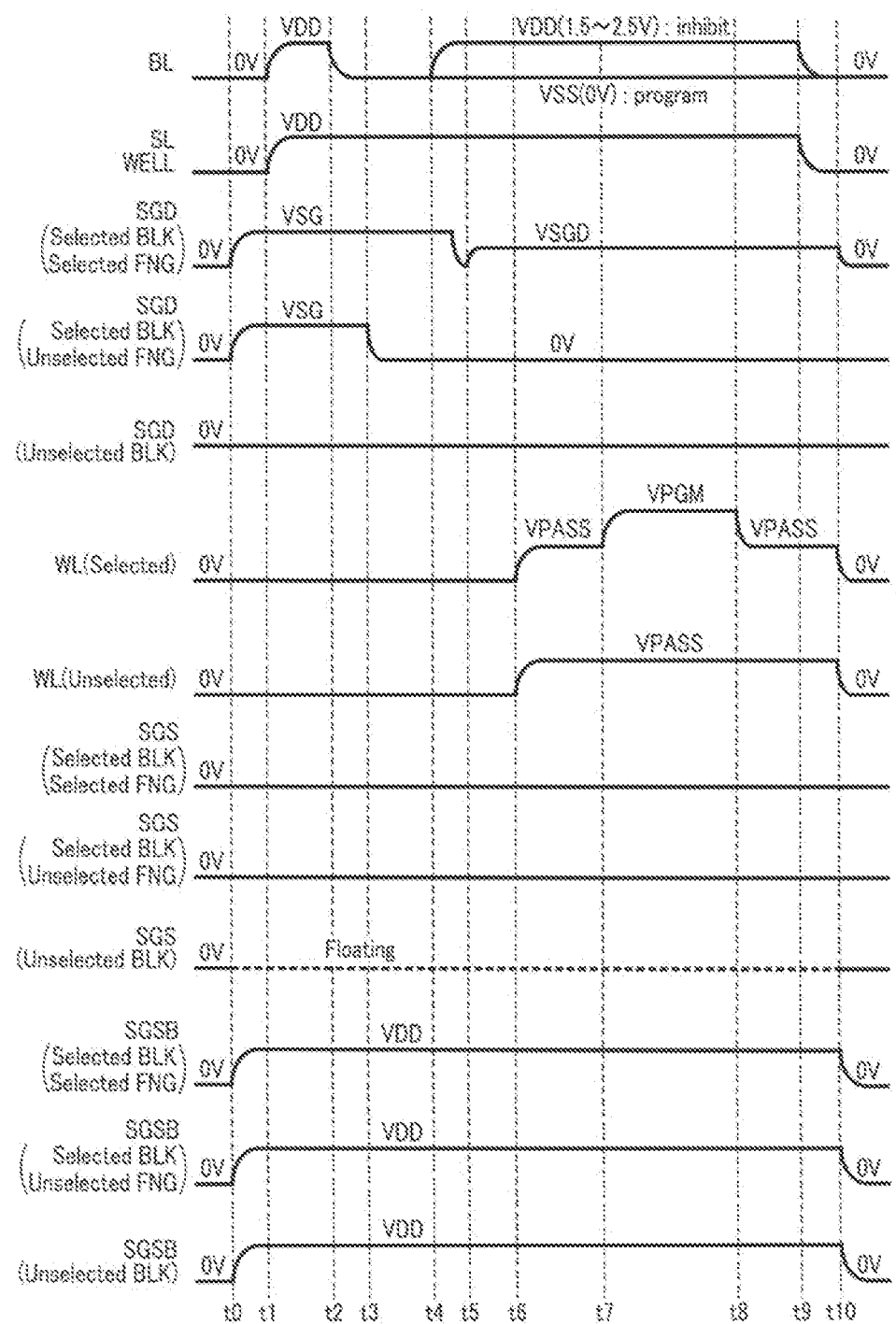
FIG. 12 is a timing chart illustrating one example of various voltages during a writing operation according to a third embodiment.

Specifically, referring to FIG. 12, at the time t0, the row decoder 12 makes the select gate line SGS in the unselected block BLK in a floating state (no voltage is given). At the time t10, the row decoder 12 applies 0 V to the select gate line SGS in the unselected block BLK. In other words, in the program mode at the time t7 to t8, the select gate line SGS in the unselected block BLK is in a floating state.

In the string in the unselected block BLK in the above-mentioned writing operation mode (especially, the program operation at the time t7 to t8), the through-current from the source line SL/well region 20 to the bit line BL is cut-off. A principle thereof will be described hereinafter.

Figure 13:
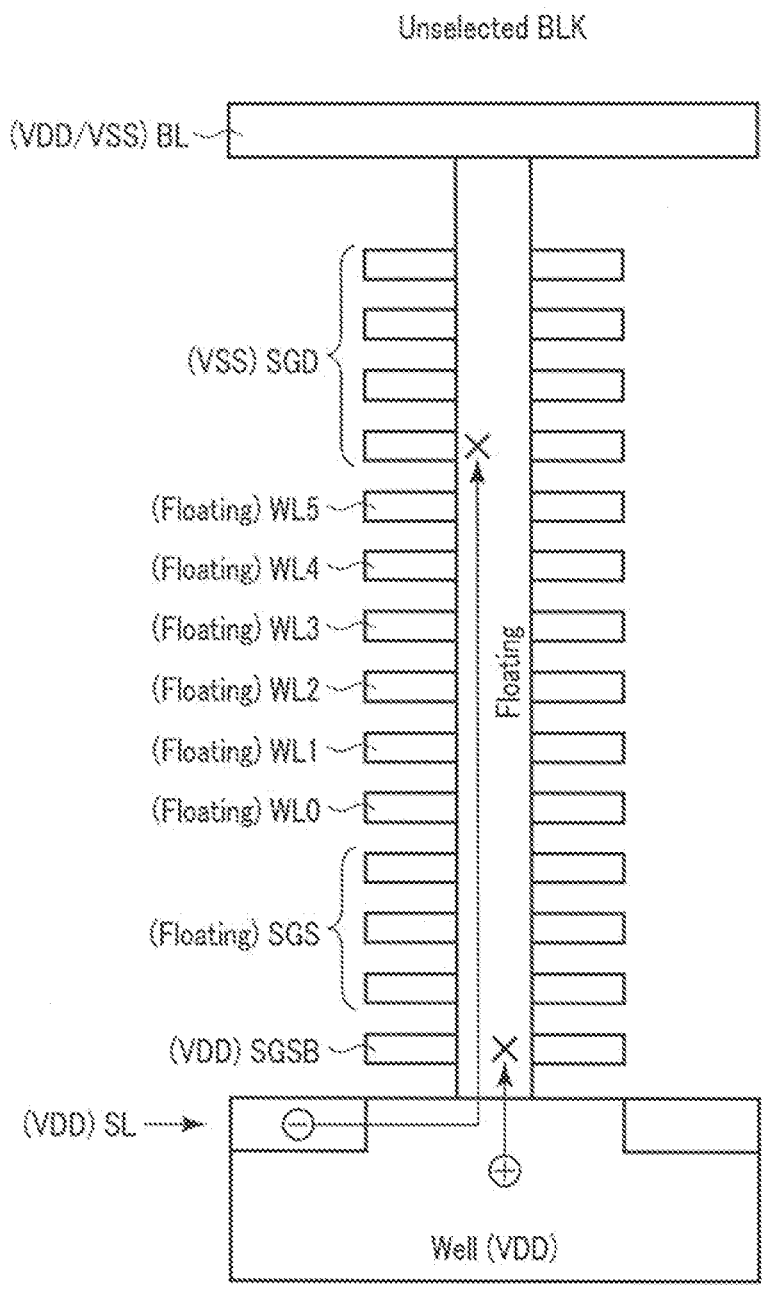
FIG. 13 is a view illustrating one example of various voltages of a string of the unselected block, that are applied during programming according to the third embodiment.

As illustrated in FIG. 13, in the program mode at the time t7 to t8, in the string in the unselected block BLK, the voltage VDD/VSS is applied to the bit line BL, the voltage VSS is applied to the select gate line SGD, the voltage VDD is applied to the select gate line SGSB, and the voltage VDD is applied to the source line and the well region 20. The select gate line SGS and the word line WL are in a floating state.

By the voltage VDD/VSS applied to the bit line BL and the voltage VSS applied to the selected gate line SGD, the select transistor ST1 is turned off. According to this, in the program mode, carriers (electrons) are not injected from the bit line BL to the channel, and the channel is in a floating state. Since the word line WL is in a floating state, the voltage of the channel is not actually raised according to the coupling with the word line WL. The voltage of the word line WL, however, is raised according to the coupling with the word line WL and the source line SL in an adjacent selected block BLK and according to this, the channel is raised to some voltage between the voltage VSS and the voltage VDD.

Here, from the viewpoint of the channel, there is no carrier in the channel and the through-current does not flow there.

From the viewpoint of the well region 20, the voltage of the channel is smaller than the voltage VDD of the well region 20 and therefore, the holes within the well region 20 tend to flow to the side of the channel. Here, the voltage VDD is applied to the select gate lines SGSB. Therefore, the holes within the well region 20 are cut-off by the select transistor ST2b, hence to avoid the generation of the through-current caused by the holes within the well region 20.

From the viewpoint of the source line SL, the voltage of the channel is smaller than the voltage VDD of the source line SL (diffusion layer 33) and therefore, the electrons within the diffusion layer 33 do not flow to the side of the channel. Even if the voltage of the channel is greater than the voltage VDD of the source line SL (diffusion layer 33), the electrons within the diffusion layer 33 are cut-off by the select transistor ST1, hence to avoid the generation of the through-current caused by the electrons within the diffusion layer 33.

Thus, it is possible to stop the generation of the through-current in the string in the unselected block BLK.

Figure 14:
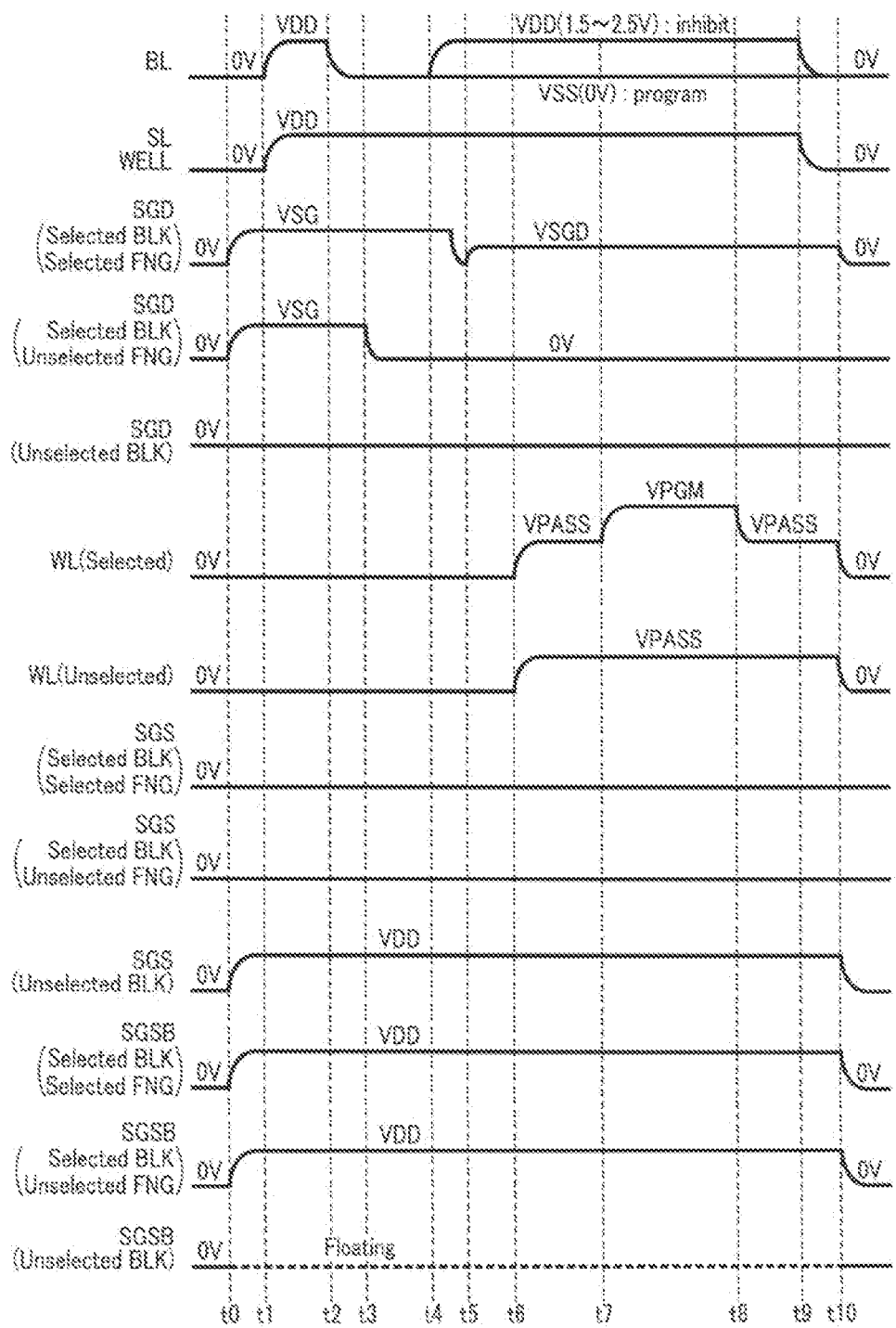
FIG. 14 is a timing chart illustrating another example of various voltages during the writing operation according to the third embodiment.
Figure 15:
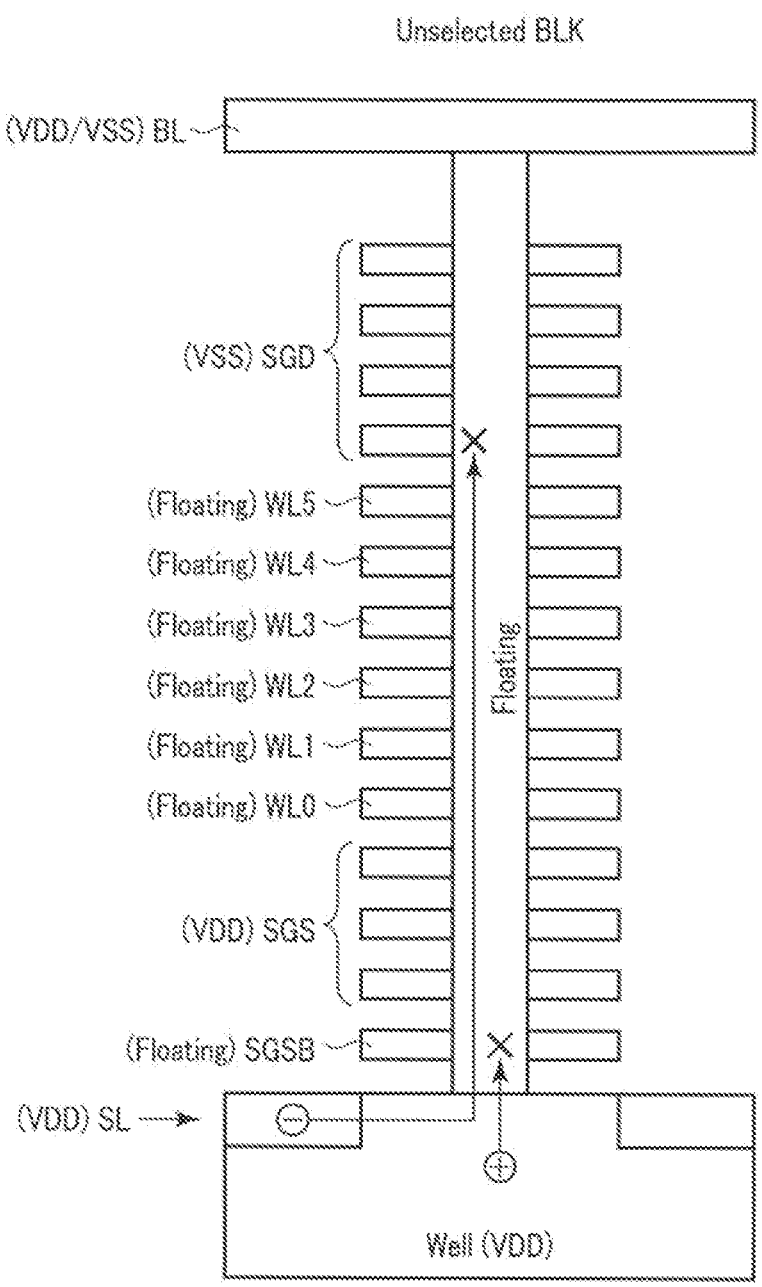
FIG. 15 is a view illustrating another example of various voltages of a string of the unselected block, that are applied during programming according to the third embodiment.

Referring now to FIGS. 14 and 15, where the voltage VDD is applied to the select gate line SGS, and the select gate line SGSB is in a floating state, the generation of the through-current may be stopped similarly. In this case, the holes within the well region 20 are cut-off by the select transistor ST2a, hence to avoid the generation of the through-current caused by the holes within the well region 20.

Effects of the Third Embodiment

In the third embodiment, the voltage VDD is applied to the select gate line SGSB, and the select gate line SGS is in a floating state. According to this, the holes within the well region 20 are cut-off by the select gate line SGSB. On the other hand, since the select gate line SGS is in a floating state, it is not necessary to operate the circuit for applying a voltage to this line. Accordingly, power consumption may be reduced.

The voltage VSS is applied to the select gate line SGD. Even if the electrons from the diffusion layer 33 flow to the channel, the electrons may be cut-off by the select gate line SGD.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cell transistors electrically connected in series;
   a bit line electrically connected to a first end of the memory cell transistors;
   a source line and a well region electrically connected to a second end of the memory cell transistors; and
   first and second selection transistors electrically connected in series between the second end of the memory cell transistors and the source line, wherein during programming of a selected memory cell transistor,
   a first voltage is applied to the source line and the well region, and to a gate of the first selection transistor, and
   a second voltage smaller than the first voltage is applied to a gate of the second selection transistor.

2. The device according to claim 1, wherein
   before the first voltage is applied to the source line and the well region, the first voltage is applied to the gate of the first selection transistor and the second voltage is applied to the gate of the second selection transistor.

3. The device according to claim 1, further comprising:
   a third selection transistor electrically connected between the first end of the memory cell transistors and the bit line, wherein during the programming of the selected memory cell transistor,
   a third voltage greater than the second voltage is applied to a gate of the third selection transistor.

4. The device according to claim 3, further comprising:
   a fourth selection transistor, a fifth selection transistor, a plurality of memory cell transistors, and a sixth selection transistor electrically connected in series, wherein
   one end of the sixth selection transistor is electrically connected to the bit line, and one end of the fourth selection transistor is electrically connected to the source line, and
   during the programming of the selected memory cell transistor, the first voltage is applied to a gate of the fourth selection transistor, and the second voltage is applied to a gate of the fifth selection transistor and a gate of the sixth selection transistor.

5. The device according to claim 3, further comprising:
   a fourth selection transistor, a fifth selection transistor, a plurality of memory cell transistors, and a sixth selection transistor electrically connected in series, wherein
   one end of the sixth selection transistor is electrically connected to another bit line, and one end of the fourth selection transistor is electrically connected to the source line, and
   during the programming of the selected memory cell transistor, the first voltage is applied to a gate of the fourth selection transistor, and the second voltage is applied to a gate of the fifth selection transistor and a gate of the sixth selection transistor.

6. The device according to claim 3, further comprising:
a fourth selection transistor, a fifth selection transistor, a plurality of memory cell transistors, and a sixth selection transistor electrically connected in series;
a first gate line connected in common to the first and fourth selection transistors;
a second gate line connected in common to the second and fifth selection transistors; and
a third gate line connected in common to the third and sixth selection transistors, wherein
one end of the sixth selection transistor is electrically connected to another bit line, and one end of the fourth selection transistor is electrically connected to the source line and the well, and
during the programming of the selected memory cell transistor, the first voltage is applied to a gate of the fourth selection transistor through the first gate line, and the second voltage is applied to a gate of the fifth selection transistor through the second gate line.

7. The device according to claim 6, wherein different voltages are applied to the bit lines during the programming of the selected memory cell transistor.

8. The device according to claim 3, further comprising:
a fourth selection transistor, a fifth selection transistor, a plurality of memory cell transistors, and a sixth selection transistor electrically connected in series, wherein
one end of the sixth selection transistor is electrically connected to a bit line, and one end of the fourth selection transistor is electrically connected to the source line, and
during the programming of the selected memory cell transistor, the first voltage is applied to a gate of the fourth selection transistor, and the second voltage is applied to a gate of the sixth selection transistor.

9. The device according to claim 8, wherein during the programming of the selected memory cell transistor, the first voltage is applied to a gate of the fifth selection transistor.

10. The device according to claim 8, wherein during the programming of the selected memory cell transistor, the second voltage is applied to a gate of the fifth selection transistor.

11. The device according to claim 8, wherein during the programming of the selected memory cell transistor, no voltage is applied to a gate of the fifth selection transistor so that the gate of the fifth selection transistor is in a floating state.

12. The device according to claim 3, further comprising:
a fourth selection transistor, a fifth selection transistor, a plurality of memory cell transistors, and a sixth selection transistor electrically connected in series, wherein
one end of the sixth selection transistor is electrically connected to a bit line, and one end of the fourth selection transistor is electrically connected to the source line, and
during the programming of the selected memory cell transistor, the first voltage is applied to a gate of the fifth selection transistor, and the second voltage is applied to a gate of the sixth selection transistor.

13. The device according to claim 8, wherein during the programming of the selected memory cell transistor, no voltage is applied to a gate of the fourth selection transistor so that the gate of the fourth selection transistor is in a floating state.

14. A semiconductor memory device comprising:
first, second, third, and fourth memory strings;
a first bit line electrically connected to first ends of the first and third memory strings;
a second bit line electrically connected to first ends of the second and fourth memory strings; and
a source line and a well region electrically connected to second ends of all the memory strings, wherein
each of the first and third memory strings includes a plurality of memory cell transistors electrically connected in series, first and second selection transistors between the memory cell transistors and the source line, and a third selection transistor between the memory cell transistors and the first bit line, and each of the second and fourth memory strings includes a plurality of memory cell transistors electrically connected in series, fourth and fifth selection transistors between the memory cell transistors and the source line, and a sixth selection transistor between the memory cell transistors and the second bit line, and
during programming of a selected memory cell transistor in the first memory string, a first voltage is applied to the source line and the well region, and also to gates of the first selection transistors and gates of the fourth selection transistors, and a second voltage smaller than the first voltage is applied to gates of the second selection transistors and gates of the fifth selection transistors.

15. The device according to claim 14, further comprising:
a fifth memory string electrically connected between the first bit line and the source line; and
a sixth memory string electrically connected between the second bit line and the source line, wherein
each of the fifth and sixth memory strings includes a plurality of memory cell transistors electrically connected in series, seventh and eighth selection transistors between the memory cell transistors and the source line, and a ninth selection transistor between the memory cell transistors and the respective bit line, and
during the programming of the selected memory cell transistor in the first memory string, the second voltage is applied to gates of the ninth selection transistors.

16. The device according to claim 15, wherein during the programming of the selected memory cell transistor, the first voltage is applied to gates of the seventh selection transistors.

17. The device according to claim 16, wherein during the programming of the selected memory cell transistor, the first voltage is applied to gates of the eighth selection transistors.

18. The device according to claim 16, wherein during the programming of the selected memory cell transistor, the second voltage is applied to gates of the eighth selection transistors.

19. The device according to claim 16, wherein during the programming of the selected memory cell transistor, no voltage is applied to gates of the eighth selection transistors so that the gates of the eighth selection transistors are in a floating state.

20. The device according to claim 15, wherein during the programming of the selected memory cell transistor, the first voltage is applied to gates of the eighth selection transistors, and no voltage is applied to gates of the seventh selection transistors so that the gates of the seventh selection transistors are in a floating state.

* * * * *